(12) United States Patent
Deguchi

(10) Patent No.: US 6,596,936 B2
(45) Date of Patent: Jul. 22, 2003

(54) METHOD FOR SUPPRESSING NOISE IN ELECTRONIC APPARATUS

(75) Inventor: Masaru Deguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 4 days.

(21) Appl. No.: 09/909,887

(22) Filed: Jul. 23, 2001

(65) Prior Publication Data

US 2002/0056559 A1 May 16, 2002

(30) Foreign Application Priority Data

Jul. 24, 2000 (JP) ........................................ 2000-221915

(51) Int. Cl.⁷ ................................................. H05K 5/00
(52) U.S. Cl. ..................... 174/35 R; 361/816; 361/818; 29/597.1
(58) Field of Search ........................ 174/35 MS, 35 GC, 174/35 R; 361/816, 818; 277/302, 305; 29/592.1

(56) References Cited

U.S. PATENT DOCUMENTS 4,717,990 A * 1/1988 Tugcu ...................... 174/35 R
4,760,496 A * 7/1988 Koch ...................... 174/35 GC
5,067,232 A * 11/1991 Seidel et al. .............. 174/35 R
5,599,027 A * 2/1997 Balsells ................. 174/35 GC

FOREIGN PATENT DOCUMENTS

| JP | 09-186480 | 7/1997 |
|----|-----------|--------|
| JP | 10-200284 | 7/1998 |

* cited by examiner

Primary Examiner—Dean A. Reichard
Assistant Examiner—W. David Walkenhorst
(74) Attorney, Agent, or Firm—Sughrue Mion, PLLC

(57) ABSTRACT

A plurality of H-shaped notches are formed on an end of a first shielding plate. Each notch has a pair of protrusions. Each protrusion has hooks on both sides. When a coil spring is fitted into each notch, the coil spring is first compressed so that a pitch thereof becomes narrower. Subsequently, the coil spring is fitted into the notch so that the coil spring encompasses the pair of protrusions. Each hook engages with the coil spring received in the notch, thereby preventing the coil spring from dropping out of the notch.

7 Claims, 4 Drawing Sheets

METHOD FOR SUPPRESSING NOISE IN ELECTRONIC APPARATUS

BACKGROUND OF THE INVENTION

1. Field of the Invention

The present invention relates to a method for suppressing noise in an electronic apparatus, in which assembling efficiency is improved, the configuration is simple, and the cost is low.

2. Description of the Related Art

As a method for suppressing EMI (it is an abbreviation for "Electromagnetic Interference" and will be referred to as "noise") in an electronic apparatus such as a communication apparatus, a shielding method utilizing a metal chassis has been generally known. The metal chassis is formed by joining a plurality of shielding plates to each other.

In the metal chassis comprising the plurality of shielding plates, it is difficult to eliminate a seam (gap) between the shielding plates in manufacturing. Such a joint gap serves as an internal-noise radiation source. When the shielding plates do not come into contact with each other with low impedance, the impedance of one plate is unmatched to that of the other one. The shielding plate in a high impedance state serves as a noise radiation antenna. Consequently, noise is not suppressed in some cases.

To solve such a problem, as disclosed in Japanese Unexamined Patent Publication (JP-A) No. H9-186480, a metallic contact called a "finger" (the detail thereof will be described below) is inserted into a joint gap between the shielding plates, or conductive Monel metal is fixed to the shielding plates to be joined to each other by double-faced tape to make both shielding plates conductive, thereby reducing the contact impedance.

Furthermore, as disclosed in Japanese Unexamined Patent Publication (JP-A) No. H10-200284, the following shielding configuration (the detail thereof will be described below) of an electronic apparatus has been proposed. That is, a shielding member comprises a coil spring and a core member and the shielding member is fitted into a chassis by a fixing member.

However, the conventional method for suppressing noise in an electronic apparatus such as a communication apparatus has the following problems.

In the electronic apparatus such as a communication apparatus, the above-mentioned noise suppression is performed. The attachment of such a countermeasure component against the noise suppression takes much time. In addition, the conductive Monel metal is easily detached from the plate. Fixing should be performed after first determining the length of the Monel metal. Accordingly, the yield is low. Since the component is exclusively used, the cost is high.

SUMMARY OF THE INVENTION:

Accordingly, it is an object of the present invention to provide a method for suppressing noise in an electronic apparatus, in which assembling efficiency is improved.

Another object of the present invention is to provide a method for suppressing noise in an electronic apparatus with a simple configuration.

Still another object of the present invention is to provide a method for suppressing noise in an electronic apparatus with low cost.

According to one aspect of the present invention, there is provided a method for suppressing noise in an electronic apparatus which is shielded with a metal chassis including shielding plates, the method comprising the steps of: forming notches on an end of a specific one of the shielding plates; compressing coil springs and fitting the coil springs into the notches; and jointing the end of the shielding plate to another shielding plate.

According to another aspect of the present invention, there is provided a method for suppressing noise in an electronic apparatus including shielding plates for shielding the electronic apparatus, the method comprising the step of: sandwiching a sealing unit, in which coil springs are compressed and then fitted into notches, between the shielding plates.

DESCRIPTION OF THE PREFERRED EMBODIMENTS

To foster a better understanding of the present invention, two conventional methods for suppressing noise in an electronic apparatus will now be described.

Figure 1:
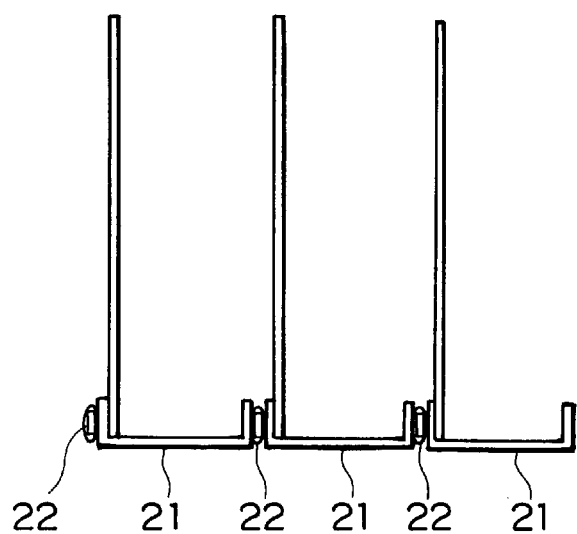
FIG. 1 is a cross-sectional view showing a shielding configuration including fingers in a conventional electronic apparatus.

First, a first conventional method for suppressing noise in an electronic apparatus will now be explained with reference to FIG. 1. A plurality of plates 21 face each other. A stick finger 22 is provided for one of the two facing plates 21. In this manner, shielding is realized.

Figure 2A:
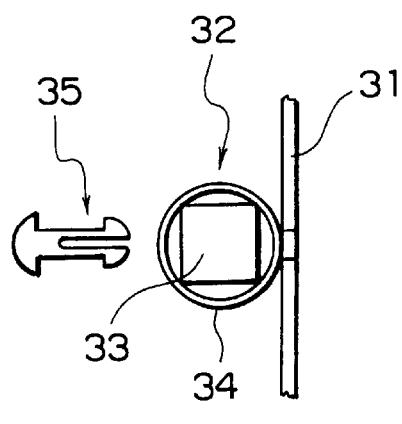
FIG. 2A is a cross-sectional view showing a state before the assembly of a shielding configuration including a coil spring in a conventional electronic apparatus.
Figure 2B:
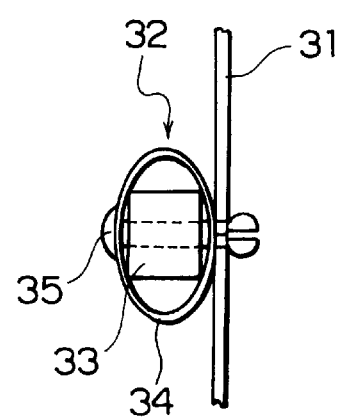
FIG. 2B is a cross-sectional view showing a state after the assembly of the shielding configuration including the coil spring in the conventional electronic apparatus.

Subsequently, a second conventional method for suppressing noise in an electronic apparatus will now be explained with reference to FIGS. 2A and 2B. A shielding member 32 comprises a core member 33 and a coil spring 34 surrounding the core member 33. The core member 33 is made of sponge, rubber, or an organic material. The coil spring 34 is made of metal. In a state shown in FIG. 2A, a fixing member 35 is fixed to a chassis 31 through the core member 33 and the coil spring 34. Consequently, the shielding member 32 is deformed as shown in FIG. 2B, the shape of the coil spring 34 is changed from a circle to an oval, and the core member 33 is compressed.

Two embodiments of the present invention will now be described hereinbelow.

Figure 3:
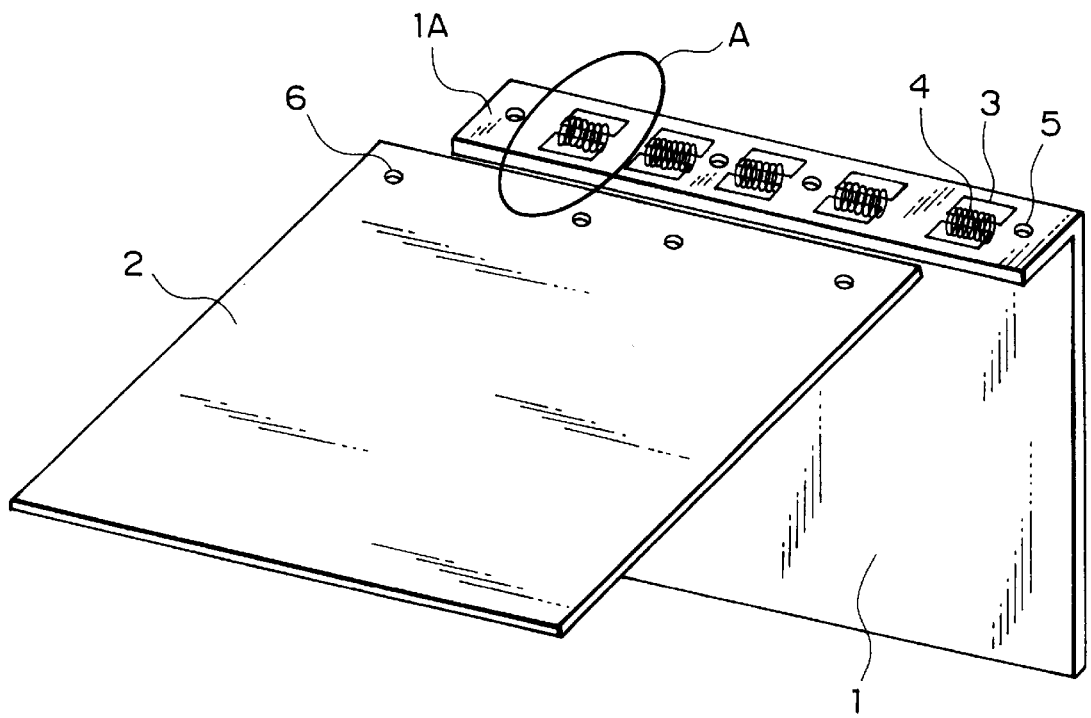
FIG. 3 is a perspective view of a metal chassis to which a method for suppressing noise in an electronic apparatus of a first embodiment according to the present invention is applied.

FIG. 3 is a perspective view of a metal chassis to which a method for suppressing noise in an electronic apparatus of a first embodiment of the present invention is applied.

A shielding plate 1 has an L-shaped form by bending an end 1A thereof at a right angle. A shielding plate 2 is flat. The shielding plate 1 is joined with the shielding plate 2 to construct a metal chassis. A plurality of H-shaped notches 3 are formed on the end IA of the shielding plate 1. A coil spring 4 is fitted into each notch 3. Each coil spring 4 is made of metal. The coil spring connects the shielding plate 1 to the shielding plate 2 and has a function of maintaining the impedance at a low value.

Screw holes 5 are formed in four positions on the end 1A of the shielding plate 1 to fix the shielding plate 2. Four screw holes 6 are formed in the shielding plate 2 so as to correspond to the four screw holes 5.

Figure 4:
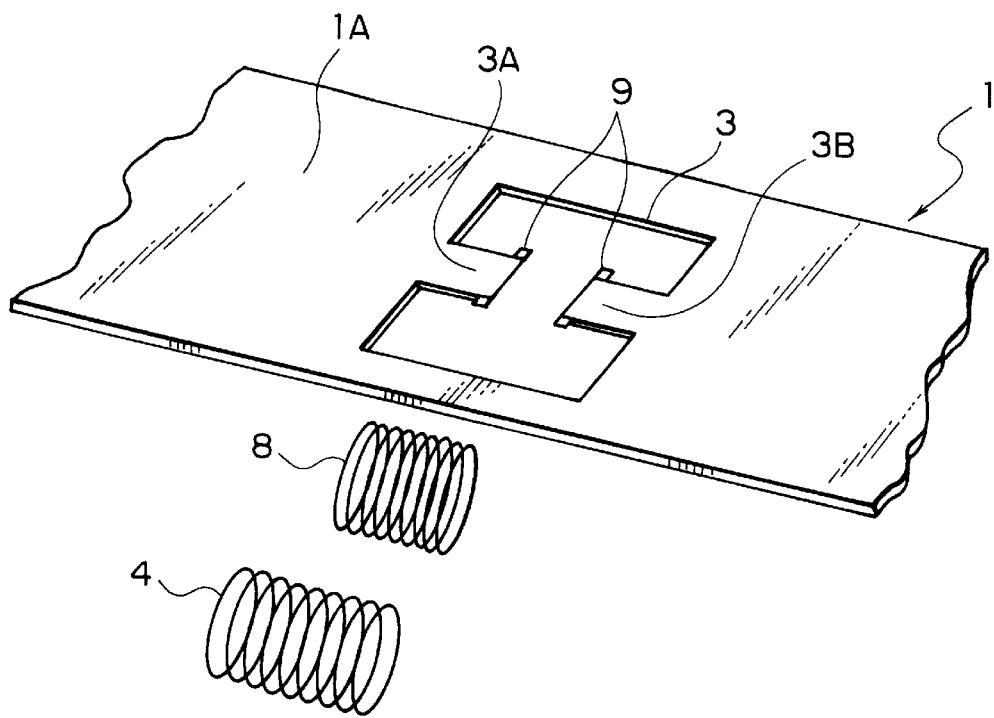
FIG. 4 is an enlarged view of a portion A in FIG. 3.

FIG. 4 is an enlarged view of a portion A in FIG. 3. The H-shaped notch 3 is formed on the end 1A of the shielding plate 1. The notch 3 has a pair of protrusions 3A and 3B. Hooks 9 are formed on both sides of each of the protrusions 3A and 3B. When the coil spring 4 is fitted into the notch 3, the coil spring 4 is first compressed so that the pitch becomes narrower like a coil spring 8. Subsequently, the coil spring 8 is inserted into the notch 3 so that the coil spring 8 encompasses the pair of protrusions 3A and 3B. Each hook 9 is engaged with the coil spring 4 received in the notch 3 to prevent the coil spring 4 from dropping out of the notch 3.

Figure 5A:
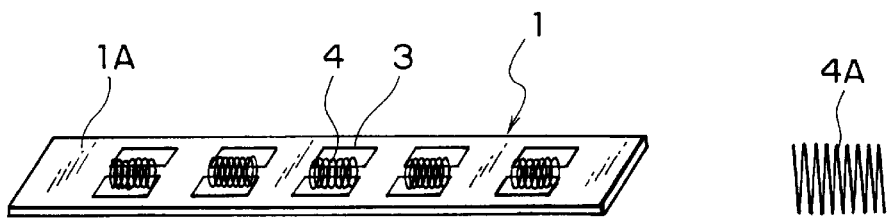
FIG. 5A is a perspective view of a state in which coil springs are received in notches formed on an end of a shielding plate according to the method for suppressing noise in the electronic apparatus of the first embodiment of the present invention, and a sectional view of the coil spring at that time.
Figure 5B:
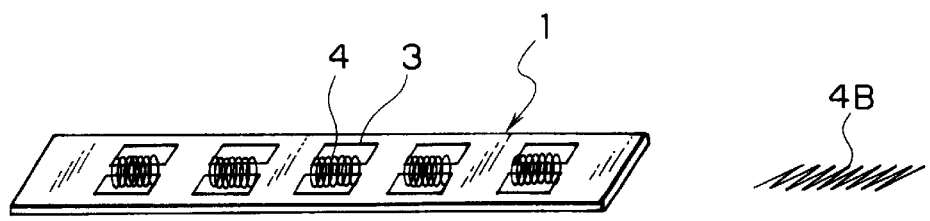
FIG. 5B is a perspective view of a state in which the coil springs are received in the notches formed on the end of the shielding plate according to the method for suppressing noise in the electronic apparatus of the first embodiment of the present invention, and a sectional view of the coil spring compressed by applying a pressure.

FIGS. 5A and 5B show states in which the coil springs 4 are received in the notches 3 formed on the end 1A of the shielding plate 1. FIG. 5A shows the coil springs 4 received in the notches 3 and shows a cross section 4A of each coil spring 4 at that time. FIG. 5B shows the coil springs 4 received in the notches 3 and shows a cross section 4B of each coil spring 4 when it is received in the notch 3 and is compressed. The cross section 4B is flat and zigzag.

The operation of the method for suppressing noise in the electronic apparatus according to the first embodiment will now be described with reference to FIGS. 3 to 5B.

The coil springs 4 are compressed and then fitted into the notches 3. Each of the coil springs 4 is engaged with the protrusions 3A and 3B having the drop-preventing hooks 9. The compressed coil springs 4 are received in the notches 3 without falling.

Although confining noise in the chassis is effective in noise suppression, it is essential that there are no gaps between the end 1A of the shielding plate 1 and the shielding plate 2. Screws (not shown) are fixed in the screw holes 5 through the round holes 6 to join the end 1A of the shielding plate 1 to the shielding plate 2. The coil springs 4 are compressed, thereby being arranged between the end 1A of the shielding plate 1 and the shielding plate 2 with no gap.

A desire for noise suppression is growing. Stabilizing the ground of a discrete communication apparatus (chassis assembled with low impedance) is one of the important items. Accordingly, it is essential to assemble the chassis at a low enough impedance. The coil springs 4, which are uniformly compressed in the gap between the end 1A of the shielding plate 1 and the shielding plate 2, function to reduce the contact impedance between the end 1A of the shielding plate 1 and the shielding plate 2. In addition to the above-mentioned effect of closing the gap, a high impedance state is prevented, so that effective noise suppression is achieved.

In the above embodiment, the notch 3 is shaped into an H-shaped form having the two protrusions 3A and 3B. The form is not limited to the above. When the notch 3 has at least one protrusion, it is possible to prevent the coil spring 4 from falling.

As mentioned above, by the method for suppressing noise in the electronic apparatus according to the first embodiment of the present invention, the coil springs 4 are compressed and then fitted into the notches 3, and the end 1A of the shielding plate 1 is joined to the shielding plate 2. Accordingly, it is unnecessary to insert or fix an expensive exclusive-use component for noise suppression. An effective noise-suppressing countermeasure can be realized with a low-cost simple configuration in which the efficiency is improved because the coil springs 4 are simply attached.

The joint of the shielding plates 1 and 2 is made without a linkage such as a tape, thereby causing no fear of falling. Since the coil spring 4 functions as a contact and is not sharp, the worker is kept safe from being hurt in an accident as a subsidiary advantage.

Since the normal coil spring 4 is used as a contact, the performance of fitting can be improved. The range of choices regarding desired length and width can be also extended. Since the coil spring 4 is a general-purpose material, a cost advantage is also achieved.

Figure 6:
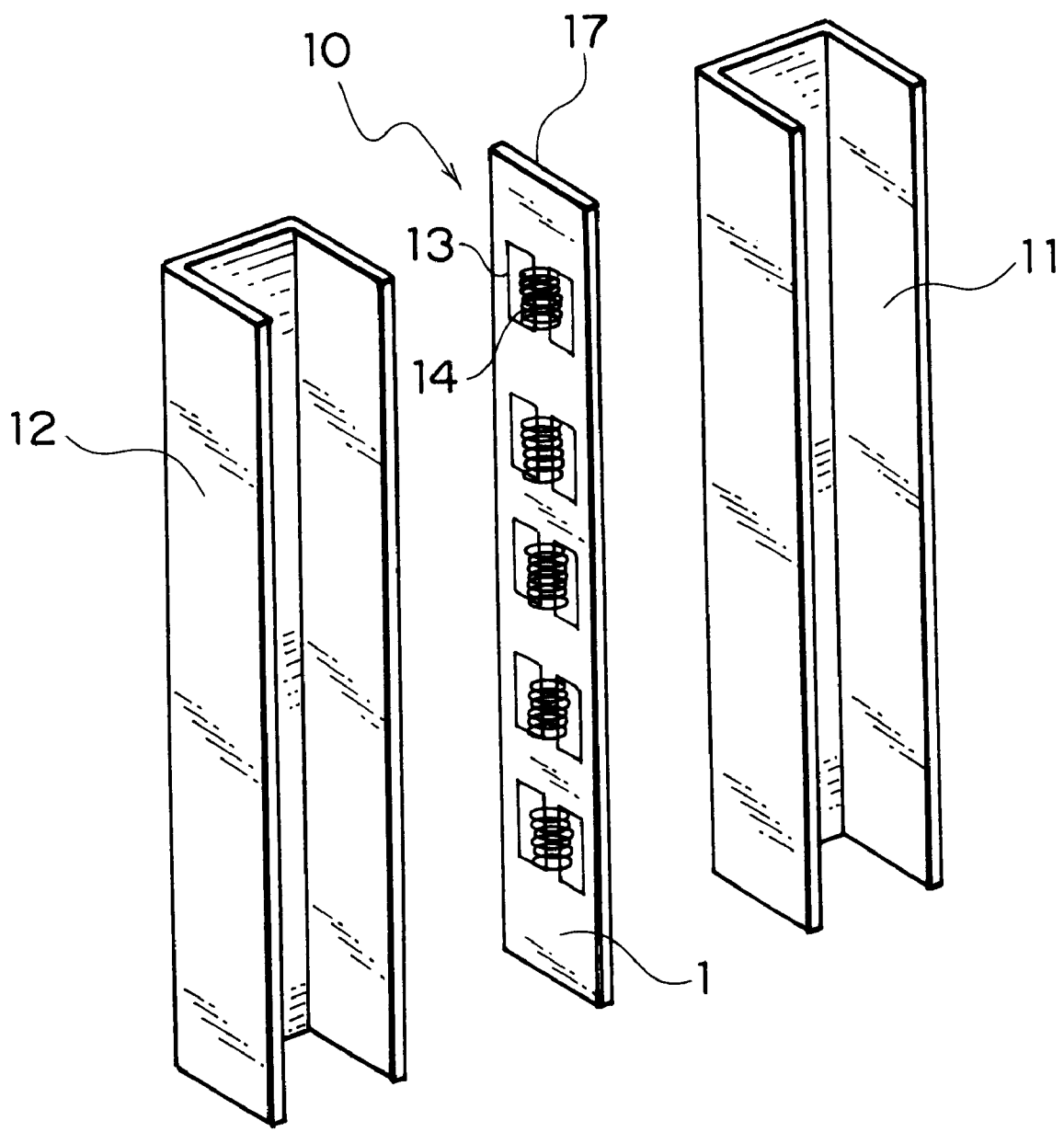
FIG. 6 is a perspective view showing shielding plates to which a method for suppressing noise in an electronic apparatus of a second embodiment of the present invention is applied.

FIG. 6 illustrates a perspective view showing shielding plates 11 and 12 to which a method for suppressing noise in an electronic apparatus according to a second embodiment of the present invention is applied.

Each of the shielding plates 11 and 12 has a U-shaped cross section. They are received in a metal chassis (not shown). A sealing unit 10 is attached to the side surfaces of the shielding plates 11 and 12. Each of notches 13 has the same form as that of the notch 3 shown in FIG. 3. The notches 13 are formed into a sealing plate 17. A coil spring 14 is fitted into each notch 13.

The operation of the method for suppressing noise in the electronic apparatus according to the second embodiment will now be described with reference to FIG. 6.

The sealing unit 10 is inserted into a gap between the shielding plates 11 and 12 to compress the coil springs 14, so that the coil springs 14 close the gap. Similar to the method for suppressing noise in the electronic apparatus of the first embodiment, the coil spring 14 functions to reduce the contact impedance in addition to the gap closing advantage. Effective noise suppression is achieved.

As mentioned above, in the method for suppressing noise in the electronic apparatus according to the second embodiment of the present invention, the sealing unit 10, in which the coil springs 14 are compressed and then fitted into the notches 13, is sandwiched between the shielding plates 11 and 12. Accordingly, it is unnecessary to use an expensive exclusive-use countermeasure against noise. The sealing unit 10 constructed by simply attaching the coil springs realizes an effective noise countermeasure with a low-cost simple configuration in which the efficiency is improved.

In the method for suppressing noise in the electronic apparatus according to the present invention, the metal chassis for shielding the electronic apparatus is constructed by a plurality of shielding plates, the notches are formed on the end of the specified shielding plate, the coil springs are compressed and then fitted into the notches, and the end of the shielding plate is joined to another shielding plate. Accordingly, an effective noise countermeasure can be realized with a low-cost simple configuration in which the efficiency is improved by simply attaching the coil springs.

Since each of the notches has an H-shaped form having the two protrusions, the coil spring can be exactly compressed and fitted into the notch, so that an effective noise countermeasure can be realized with a low-cost simple configuration in which the efficiency is improved.

Since each notch has the drop-preventing hooks for the coil spring in the protrusions, the coil spring does not fall out of the notch, so that an effective noise countermeasure can be realized with a low-cost simple configuration in which the efficiency is improved.

Since the specific shielding plate is L-shaped by bending the end thereof, the shielding plates can accurately constitute the metal chassis for shielding the electronic apparatus, so that an effective noise countermeasure can be realized with a low-cost simple configuration in which the efficiency is improved.

In the method for suppressing noise in the electronic apparatus of the present invention, a plurality of shielding plates for shielding the electronic apparatus are used and the sealing unit, in which the coil springs are compressed and fitted into the notches, is sandwiched between the shielding plates. Consequently, an effective noise countermeasure can be realized with a low-cost simple configuration in which the efficiency is improved by the sealing unit simply formed by attaching the coil springs.

Furthermore, since the sealing unit is sandwiched between the shielding plates each of which has a U-shaped cross section, the sealing unit can be accurately sandwiched between the shielding plates. Consequently, an effective noise countermeasure can be made with a low-cost simple configuration in which the efficiency is improved.

What is claimed is:

1. A method for suppressing noise in an electronic apparatus which is shielded by a metal chassis including shielding plates, the method comprising the steps of:

forming notches on an end of a specific one of the shielding plates;

compressing coil springs and fitting the coil springs into the notches; and joining the end of the shielding plate to another shielding plate.

2. A method according to claim 1, wherein the end of the specific shielding plate is bent in an L-shaped form.

3. A method according to claim 1, wherein each of the notches is formed in an H-shaped form having two protrusions.

4. A method according to claim 3, wherein each of the protrusions has hooks for preventing the coil spring from falling.

5. A method for suppressing noise in an electronic apparatus including shielding plates for shielding the electronic apparatus, the method comprising the step of:

sandwiching a sealing unit, in which coil springs are compressed and then fitted into notches, between the shielding plates.

6. A method according to claim 5, wherein the sealing unit is sandwiched between the side surfaces of the shielding plates, the plate having a U-shaped cross section.

7. A method according to claim 1 or 5, wherein the coil springs are compressed to be flat and zigzag.

* * * * *